(12) United States Patent
Dierschke

(10) Patent No.: US 7,626,241 B1
(45) Date of Patent: Dec. 1, 2009

(54) THIN FILM INTERFERENCE RIPPLE REDUCTION

(75) Inventor: Eugene G. Dierschke, Dallas, TX (US)

(73) Assignee: Texas Advanced Optoelectronic Solutions, Inc., Plano, TX (US)

( * ) Notice: Subject to any disclaimer, the term of this patent is extended or adjusted under 35 U.S.C. 154(b) by 0 days.

(21) Appl. No.: 12/103,749

(22) Filed: Apr. 16, 2008

Related U.S. Application Data

(60) Provisional application No. 60/913,328, filed on Apr. 23, 2007.

(51) Int. Cl.
*H01L 31/058* (2006.01)

(52) U.S. Cl. .................................. 257/464; 257/461
(58) Field of Classification Search ................ 257/461, 257/464
See application file for complete search history.

(56) References Cited

U.S. PATENT DOCUMENTS 7,112,511 B2 * 9/2006 Hong ..................... 438/427

* cited by examiner

*Primary Examiner*—Douglas M Menz
(74) *Attorney, Agent, or Firm*—Locke Lord Bissell & Liddell, LLP

(57) ABSTRACT

A thin film structure for an optical sensor to achieve a wavelength window with nearly ripple free reflection and transmission has different areas of thin film with two or more different thicknesses.

16 Claims, 6 Drawing Sheets

THIN FILM INTERFERENCE RIPPLE REDUCTION

RELATED APPLICATION

The present application claims the benefit of U.S. Provisional Application Ser. No. 60/913,328 filed Apr. 23, 2007.

TECHNICAL FIELD OF THE INVENTION

The present invention relates to photodiode optical sensors, and more particularly to deposited thin film layers with different thicknesses.

BACKGROUND OF THE INVENTION

Silicon photodiode optical sensors which convert light to current generally have non-ideal spectral response characteristics due to thin film interference effects of the silicon dioxide layers deposited on the silicon of the sensor during wafer processing. The thin film generates an interference ripple superposed on the photodiode response. The interference ripple is caused by a wavelength dependent variation of the reflection and thus of the transmission. For many applications, the amplitude of the interference ripple is a more important issue than the absolute value of photodiode response.

The reflection for normal incident light of a composite Material1-Material2-Material3 stacked structure where Material2 is a thin film is:

$$R = [R1^2 + R2^2 + (2*R1*R2*\cos(OF))]/[1 + R1^2*R2^2 + (2*R1*R2*\cos(OF))]$$

where:

R1=Reflection Factor at Material1-to-Material2 interface

R1=(N2−N1)/(N2+N1)

R2=Reflection Factor at Material2-to-Material3 interface

R2=(N3−N2)/(N3+N2)

OF=Optical Factor

OF=(4*PI*N2*T2/W)

N1=Refractive Index of Material1

N2=Refractive Index of Thin Film Material2

N3=Refractive Index of Material3

PI=3.1416

T2=Thickness of Thin Film Material2

W=Optical Wavelength

The transmission thru this stacked structure is (1−R).

A historical approach to minimize reflection for simple photodiodes has been to deposit a thin film which ideally has:

$$N2*T2 = Wd/4 \text{ (quarter-wavelength thin film)}$$

$$N2 = SQRT(N1*N3)$$

where

Wd=Design Wavelength

For this ideal thin film, R1=R2 and R=0 at design wavelength. But the reflection at other wavelengths can be as high as $(4R1^2)/((1+R1^2)^2)$. This approach is usually not compatible with standard silicon integrated circuit processing.

Another approach used to achieve certain reflection characteristics is the use of complex stack of multiple layers of thin films with different materials having at least two different refractive indices. But this approach generally requires custom materials and/or processes.

Photodiodes and other optical sensors are now being integrated into complex silicon integrated circuits which have embedded signal processing. Thus the basic thin film is silicon dioxide and is inherent in the wafer processing. Also with multiple interconnect metal layers used in advanced silicon technologies, the silicon dioxide is relatively thick, which results in the interference ripple having amplitude peaks which are closely spaced. In a typical application, the photodiode integrated circuit is encapsulated in a clear plastic package.

An example of a typical structure is shown in FIG. 1:

N1=1.55 for Material1 transparent plastic used for packaging.

N2=1.46 for Material2 Silicon Dioxide at 550 nm.

N3=4.08 for Material3 Silicon at 550 nm.

The refractive indices are assumed to be constant for enclosed examples but actually the refractive indices can be wavelength dependent.

The reflection due to the plastic-oxide-silicon stack is shown in FIG. 2 for T2=4.0 um=4000 nm for the 400-700 nm visible wavelength range. The peak-to-peak amplitude of the interference ripple on reflection is (0.251−0.202)=0.049. The thin film transmission (1−R) would exhibit same variation. A need has thus arisen for an optical sensor with minimal thin film interference ripple.

SUMMARY OF THE INVENTION

The present invention is a structure consisting of a Material2 thin film with areas of different thicknesses located between two other materials (Material1 and Material3), as shown in FIG. 3. For total area with two different thicknesses, the area of each Material2 thin film thickness is 50% of total area and may be single continuous area or combination of multiple areas. A thickness difference is selected to reduce effect of interference ripple caused by the Material2 thin film, by averaging over the total area. The optimum Material2 thickness difference (T2A−T2B) is Wd/(4*N2) where Wd is the design wavelength and N2 is the refractive index of Material2. For this thickness and design wavelength, the thin film reflection interferences for the two areas are 180 degrees out of phase and thus are canceled when averaged together. The interference ripple reduction is not dependent on absolute value of T2A or T2B, only on the difference (T2A−T2B). A wavelength window of nearly ripple free reflection and transmission can be achieved.

Additional reduction of effect of interference ripple can be achieved by using larger even number of Material2 layer thicknesses with appropriate values with area for each thickness equal in size. The extreme limit is a continuous linear slope in Material2 with thickness varying from T2A to T2A−(Wd/(2*N2)).

This design approach is also used to minimize interference effect for different design wavelengths for different defined areas on same Material2 thin film.

The thickness differences in thin film structure can be manufactured by, for example, masking and etching process steps.

The invention also reduces the variation of thin film interference ripple with angles from normal incidence.

BRIEF DESCRIPTION OF THE DRAWINGS

For a more complete understanding of the present invention and for further advantages thereof, reference is now made to the following description taken in conjunction with the accompanying drawings in which.

DESCRIPTION OF THE PREFERRED EMBODIMENTS

Figure 1:
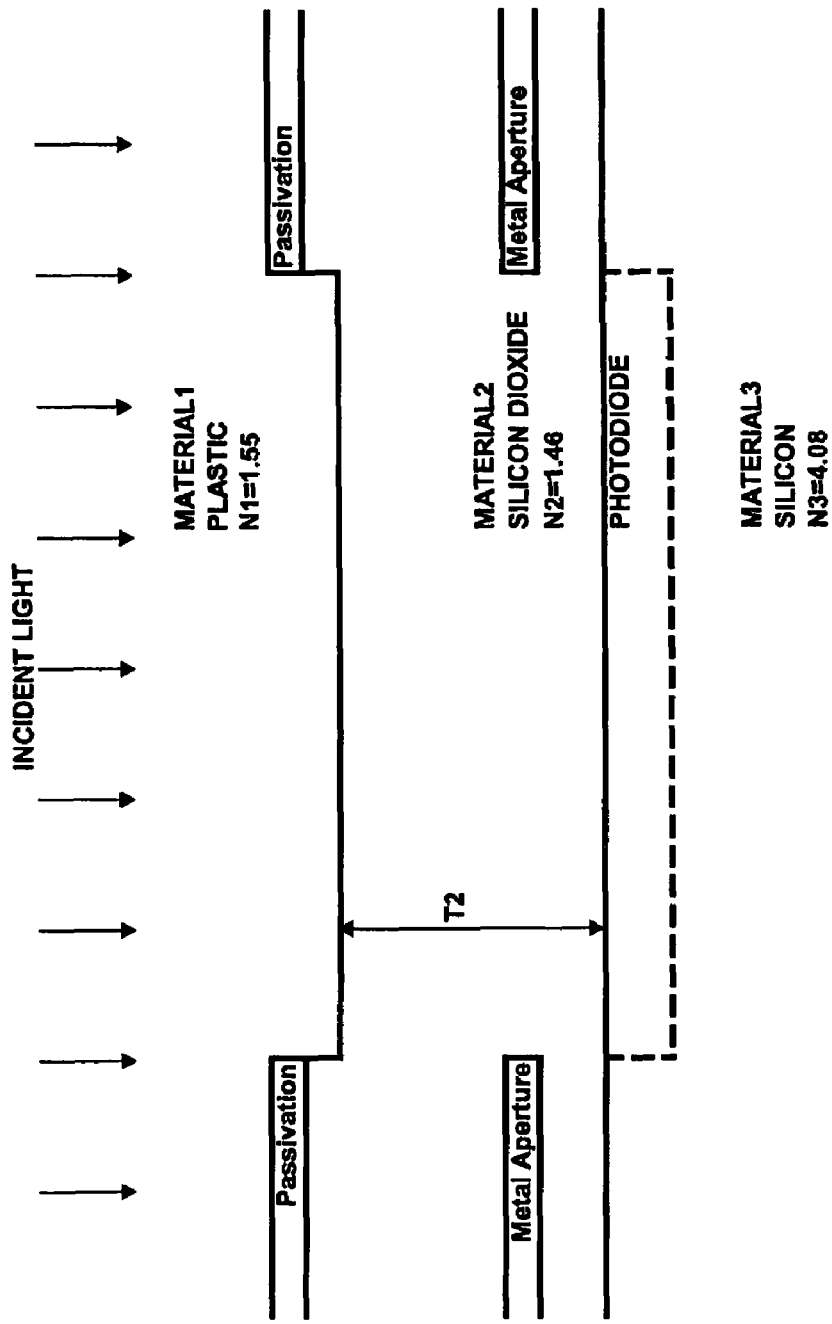
FIG. 1 is a diagrammatic cross-sectional view of a photodiode and single thickness film structure.
Figure 2:
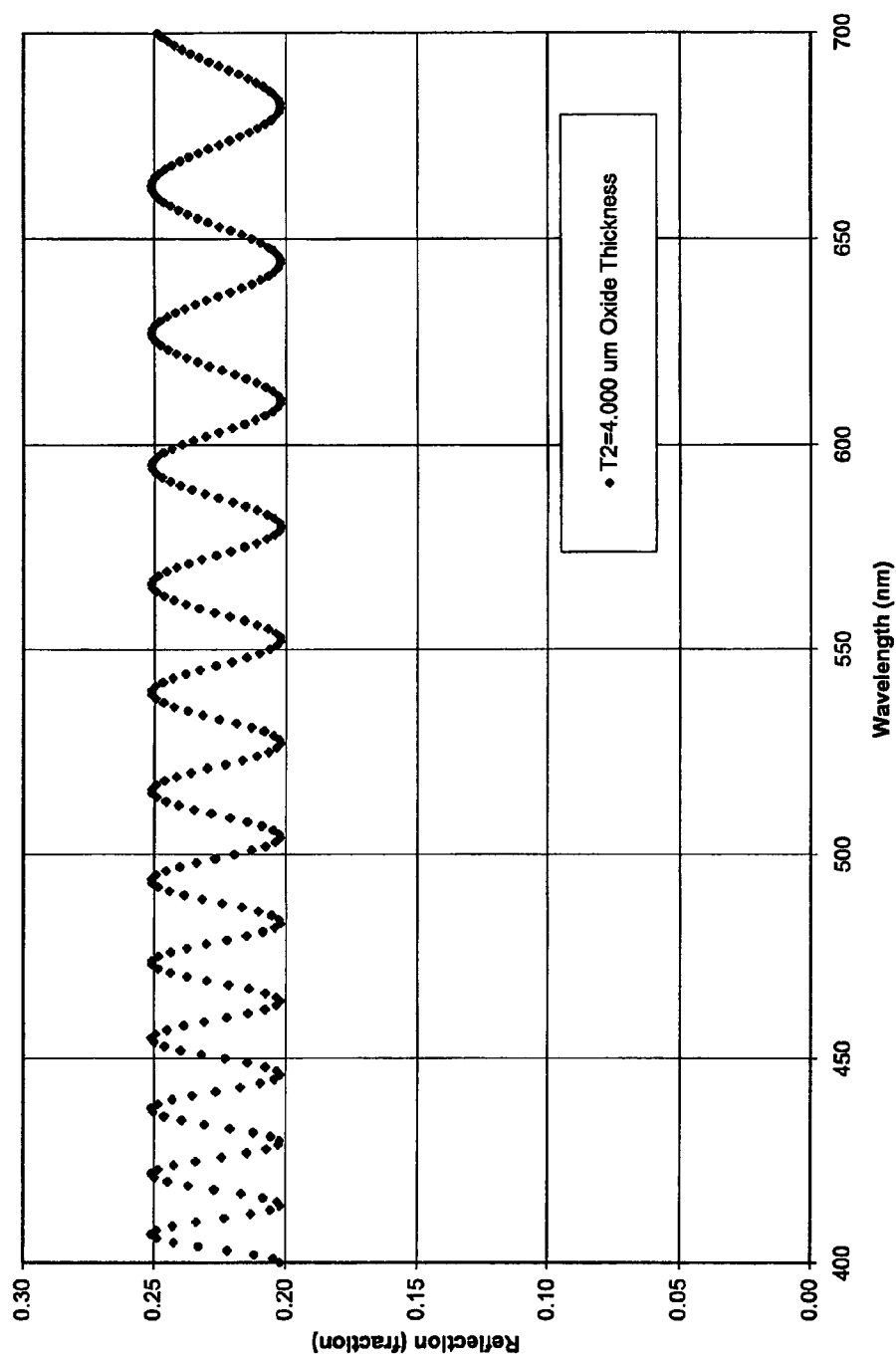
FIG. 2 is a graph of reflection vs. wavelength for the structure shown in FIG. 1.
Figure 3:
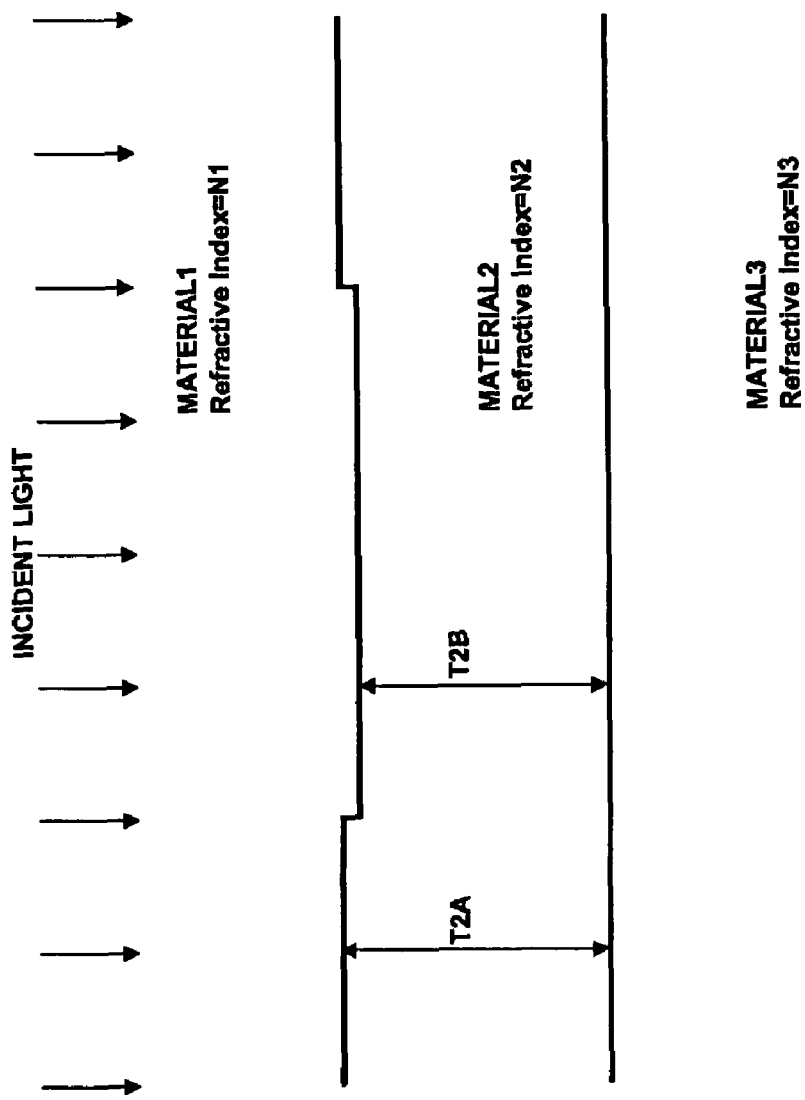
FIG. 3 is a diagrammatic cross-sectional view of a photodiode and a multiple thickness film structure.
Figure 4:
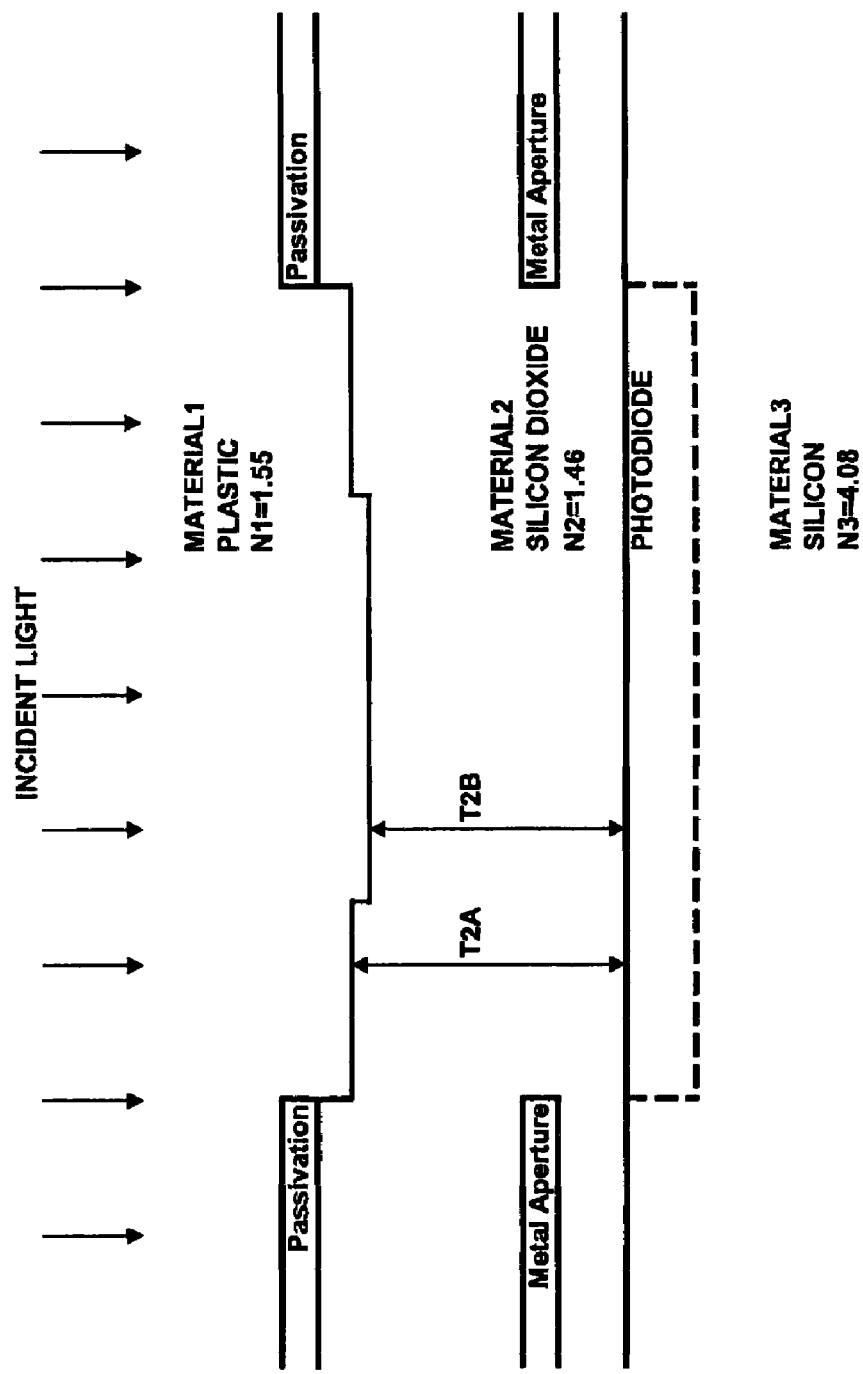
FIG. 4 is a diagrammatic cross-sectional view of a photodiode and a multiple thickness film structure.

An example of the present invention using two different thicknesses for the thin oxide film over the photodiode is shown in FIG. 4.

T2A oxide thickness used for 50% of photodiode area.

T2B oxide thickness used for 50% of photodiode area.

with $$T2A-T2B=Wd/(4*N2)$$

where

Wd=design wavelength

N2=Refractive Index of Thin Film Material2

Under this condition, the thin film reflection interferences of the two areas are 180 degrees out of phase at the design wavelength Wd which compensates for the thin film effect when the reflections for the two different areas are averaged together. Although exact interference compensation ideally applies only at the design wavelength Wd, the compensation also reduces thin film effect at other wavelengths. A wavelength window of nearly ripple free reflection and transmission can be achieved.

Figure 5:
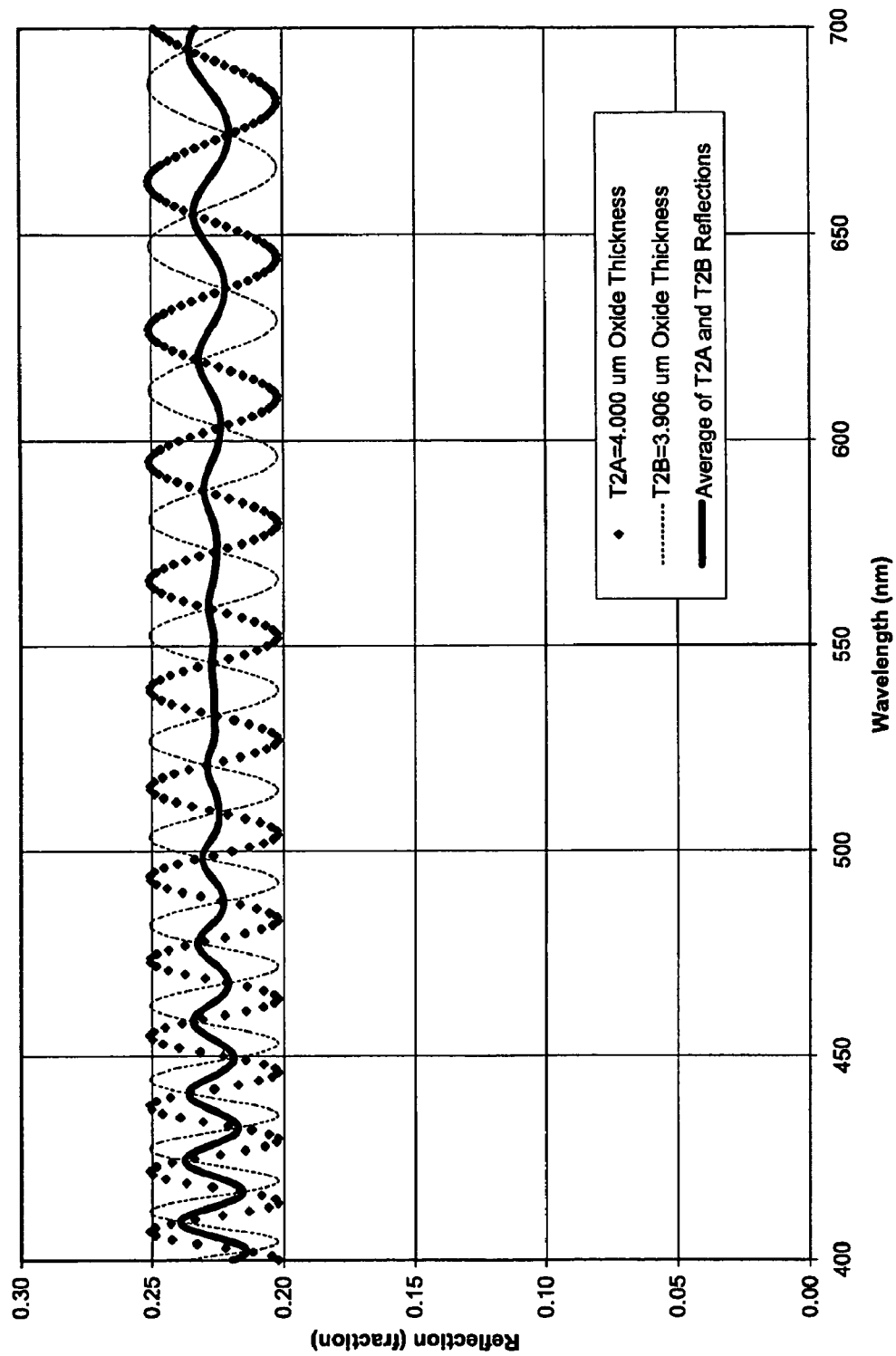
FIG. 5 is a graph of reflection vs. wavelength for the structure shown in FIG. 4.

An example of reduced reflection ripple is shown in FIG. 5 where:

Wd=550 nm=0.55 um=Design Wavelength

T2A=4.000 um

T2A−T2B=Wd/(4*N2)=0.094 um=940 nm=940 A.

T2B=3.906 um

For this example, the peak-to-peak interference ripple is reduced from 0.049 to:

1. 0.006 for 500-600 nm wavelength window.

2. 0.025 for 400-700 nm wavelength window.

A key parameter is the oxide thickness difference between Area A and Area B (FIG. 4), and reduction of interference ripple is not dependent on the absolute oxide thickness, which can vary greatly with standard silicon wafer fab processing. The two areas with different oxide thicknesses can be achieved during silicon wafer processing with one additional mask and one additional oxide etch step.

Figure 6:
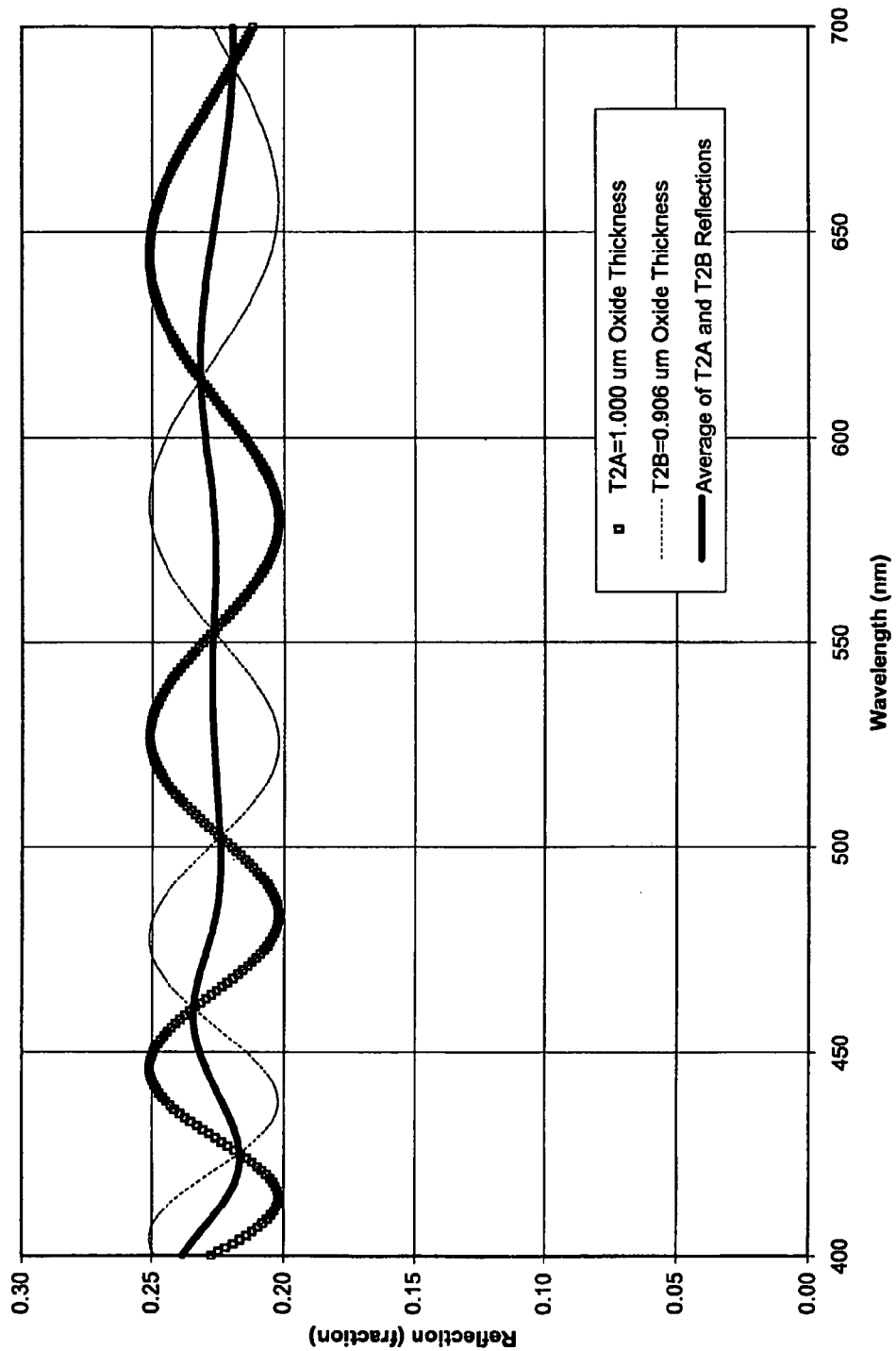
FIG. 6 is a graph of reflection vs. wavelength for the structure shown in FIG. 4.

An additional example of reduced reflection ripple is shown in FIG. 6 for a much thinner oxide but with the same difference in oxide thickness between the two areas:

Wd=550 nm=0.55 um=Design Wavelength

T2A=1.000 um

T2B=0.906 um

An additional 2× reduction of interference ripple for 400-700 nm wavelength range can be achieved by splitting total area into four equal areas with different Material 2 oxide thicknesses:

1. T2A

2. T2B=TA2−(Wd/(4*N2))

3. T2C=TA2−(Wd/(8*N2))

4. T2D=TA2−(3*Wd/(8*N2))

Additional reduction of the effect of the interference ripple can be achieved with larger even number of areas with appropriate oxide thicknesses. The extreme limit would be to have a continuous linear slope in oxide with thickness varying from T2A to T2A−(Wd/(2*N2)).

One type of optical sensor has color filters deposited on separate photodiodes on the same integrated circuit die. Each color filter transmits primarily a narrow wavelength range of light. The invention can be used to optimize for each photodiode the oxide thickness difference for the wavelength for which each filter has maximum transmission. This can generate a nearly ripple free wavelength window matching the wavelengths transmitted by each color filter.

Although specific examples have been provided, the invention to reduce effect of interference ripple caused by optical thin film effects can apply also to:

1. Any type of optical sensor and material system.
2. Any type of stacked structures with intermediate thin film, including ones not related to optical sensors.
3. More complex stacked structures with multiple thin films.
4. Thickness difference of thin film can be achieved by patterns on opposite sides of Material2.
5. Material1 and/or Material3 can be AIR with N=1.0.
6. Material2 could be AIR with N=1.0.
7. Thickness difference of thin film can be achieved by increased Material2 thickness by having a depression in Material1 and/or Material3, for example if thin film is air or liquid.
8. The areas of different thicknesses can be on physically separated pieces of Material2.
9. The phase difference of the interference ripple can be achieved by two or more types of Material2 with different refractive indices, with appropriate thicknesses.

While specific embodiments of the invention has been shown and described, various alternatives and modifications will be obvious to those skilled in the area. All such modifications are intended to fall within the scope of this invention.

I claim:

1. A sensor comprising:

a first material layer for receiving incident light;

a second material layer disposed adjacent to said first material layer, said second material layer including a first area having a thickness and a second area having a thickness different from said first area thickness, said thickness difference between said first and second areas being selected to reduce the effect of interference ripple on the spectral transmission of the sensor that is created by optical thin film effects of said second material layer; and a third material layer disposed adjacent to said second material layer, said third material layer including an optical detector.

2. The sensor of claim 1 wherein said first area is about one half the total area of said second material layer.

3. The sensor of claim 1 wherein said first area includes multiple areas having the same thickness.

4. The sensor of claim 1 wherein said second area includes multiple areas having the same thickness.

5. The sensor of claim 1 wherein said thickness difference between said first area and said second area is about Wd/4*N2;

where Wd is the designed wavelength of the sensor and N2 is the refractive index of the second material layer.

6. The sensor of claim 1 wherein said second material layer includes multiple areas with different thicknesses.

7. The sensor of claim 6 wherein a first area of said second material layer has a first thickness and a second area of said second material layer has a continuous linear slope of thicknesses.

8. The sensor of claim 7 wherein said second area of said second material layer has a thickness difference between said first area and said second area which varies from zero to about Wd/2*N2;

where Wd is the designed wavelength of the sensor and N2 is the refractive index of the second material layer.

9. The sensor of claim 1 wherein the sensor includes multiple designed wavelengths and corresponding thickness differences in different areas of said second material layer.

10. The sensor of claim 1 wherein said first and second areas are generated using a masking process.

11. The sensor of claim 1 wherein said first and second areas are generated using an etching process.

12. The sensor of claim 1 wherein said first material layer comprises plastic material, said second material layer comprises silicon oxide material and said third material layer comprises silicon.

13. The sensor of claim 1 wherein the designed wavelength of the sensor is 550 nanometers, the refractive index of said second material layer is about 1.46 and said thickness difference is about 940 Angstroms.

14. The sensor of claim 1 wherein said second material layer includes multiple layers of different materials having a plurality of refractive indices.

15. The sensor of claim 14 wherein the sensor includes multiple designed wavelengths selected corresponding to wavelengths of maximum optical transmission of color filters deposited on the sensor.

16. The sensor of claim 1 wherein said first material layer comprises air having a refractive index of about 1.00.

\* \* \* \* \*